(12) United States Patent
Park et al.

(10) Patent No.: US 6,723,215 B2
(45) Date of Patent: Apr. 20, 2004

(54) SPUTTERING APPARATUS FOR FORMING A METAL FILM USING A MAGNETIC FIELD

(75) Inventors: Young-Kyou Park, Seoul (KR); Hyeon-Ill Um, Seongnam-Si (KR); Jai-Kwang Shin, Uiwang-Si (KR); Seong-Gu Kim, Pyeongtak-Si (KR)

(73) Assignee: Samsung Electronics Co., Ltd., Suwon (KR)

( * ) Notice: Subject to any disclaimer, the term of this patent is extended or adjusted under 35 U.S.C. 154(b) by 48 days.

(21) Appl. No.: 10/106,220

(22) Filed: Mar. 27, 2002

(65) Prior Publication Data

US 2003/0052001 A1 Mar. 20, 2003

(30) Foreign Application Priority Data

Sep. 12, 2001 (KR) ........................................ 2001-56238

(51) Int. Cl.[7] ............................................. C23C 14/35
(52) U.S. Cl. ................................ 204/298.2; 204/298.19
(58) Field of Search ......................... 204/298.19, 298.2

(56) References Cited

U.S. PATENT DOCUMENTS

| | | | |
|---|---|---|---|
| 4,995,958 A | 2/1991 | Anderson et al. | 204/298.2 |
| 5,252,194 A | 10/1993 | Demaray et al. | 204/298.2 |
| 5,746,897 A | * 5/1998 | Heimanson et al. | 204/298.19 |
| 6,024,843 A | 2/2000 | Anderson et al. | 204/192.12 |
| 6,121,134 A | 9/2000 | Burton et al. | 438/652 |
| 6,183,614 B1 | 2/2001 | Fu | 204/298.2 |
| 6,228,236 B1 | 5/2001 | Rosenstein et al. | 204/298.2 |
| 6,274,887 B1 | 8/2001 | Yamazaki et al. | 257/72 |

FOREIGN PATENT DOCUMENTS

| | | | | |
|---|---|---|---|---|
| JP | 62-1865 | * | 1/1987 | .............. 204/298.2 |
| JP | 62001865 A | | 1/1987 | |
| JP | 63-149374 | | 6/1988 | |
| JP | 5-179441 | | 7/1993 | |
| JP | 5-166346 | | 6/1995 | |
| JP | 07166346 A | | 6/1995 | |
| KR | 2000-0253082 | * | 1/2000 | |

OTHER PUBLICATIONS

English Abstract of Japan 62–1865.*
English Abstract of Korea 2000–0253082.*

* cited by examiner

*Primary Examiner*—Rodney G. McDonald
(74) *Attorney, Agent, or Firm*—Volentine Francos, PLLC

(57) ABSTRACT

A sputtering apparatus includes a sputtering chamber, a target disposed in the sputtering chamber, and a magnetic field generator for generating a rotating magnetic field at the front of the target. The magnetic field generator includes a main magnetic field-generating part that faces the back of the target and is horizontally (laterally) offset from a vertical line passing through the center of the target. A magnetic annulus of the main magnetic field-generating part forms a magnetic enclosure having openings therethrough at locations faced in the directions of the central and peripheral portions of the target. The magnetic field-generating part thus produces a magnetic field having a non-uniform distribution at the front of the target. A substrate is positioned within the sputtering chamber facing the front of the target. A metal layer is formed by sputtering atoms from the front of the target onto the substrate. The behavior of the sputtered atoms can be effectively controlled by the magnetic field.

18 Claims, 12 Drawing Sheets

SPUTTERING APPARATUS FOR FORMING A METAL FILM USING A MAGNETIC FIELD

BACKGROUND OF THE INVENTION

1. Field of the Invention

The present invention relates to a sputtering apparatus. More particularly, the present invention relates to a sputtering apparatus that generates a magnetic field in front of a target while forming a metal layer on a substrate.

2. Description of the Related Art

Recently, the design of semiconductor devices has rapidly progressed as the use of means, such as a computers, for information processing becomes more wide-spread. In particular, this progress has required semiconductor devices to function at higher operating speeds, and to have larger storage capacities. In order to satisfy such requirements, semiconductor devices with increased density, reliability, and response time are under development. Accordingly, design requirements of a metal layer, for use in forming a wiring pattern in a semiconductor device, are becoming stricter.

The metal layer is generally formed by sputtering a metal, such as titanium, titanium nitride, aluminum, and the like, from a target onto a substrate. Research and development of sputtering methods for forming such metal layers has concentrated on improving the step coverage of the metal when deposited over a fine structure and improving the uniformity of the thickness of the metal layer when formed over a relatively large area on the substrate.

In order to perform sputtering most effectively, a magnetic field is generally employed. The use of a magnetic field allows the very desirable process conditions of low pressure and high density plasma to be achieved. Under these conditions, the particles sputtered from the target travel with a high degree of linearity. As a result, the step coverage is good. In addition, an element that generates the magnetic field is rotated to effectively control the behavior of the sputtered particles. Thus, uniformity in the thickness of the metal layer can be achieved in addition to the good step coverage. Therefore, the technique of using a rotating magnetic field to form a metal layer by sputtering has recently gained attention.

For instance, sputtering methods using a magnetic field are disclosed in U.S. Pat. No. 6,228,236 (issued to Rosenstein et al.), U.S. Pat. No. 6,183,614 (issued to Fu) and U.S. Pat. No. 4,995,958 (issued to Anderson et al.), Japanese Patent Laid-open Publication Nos. Hei 8-74051 and Hei 9-310174, and Korean Patent Laid-open Publication No. 98-65920.

However, despite the use of a magnetic field, the sputtering methods disclosed in the publications listed above may produce defects. In particular, the methods frequently generate a defect during the formation of a metal layer when the critical dimension of the semiconductor device is no more than 0.15μ or when the metal layer is formed on a patterned layer whose opening(s) has an aspect ratio of 5:1 or more. This defect, produced by a local corrosion of the target, may take the form of, for example, an overhang around the opening.

FIG. 1 is a graph of the corrosion profile of a target when using a sputtering apparatus having a magnetic field-generating member of the type disclosed in U.S. Pat. No. 4,995,958. The target corrosion depth in FIG. 1 is in millimeters.

Referring to FIG. 1, when a titanium layer is formed under a pressure of 5 mTorr, the corrosion at the central portion of the target is more severe than at the periphery of the target. Therefore, it is difficult to obtain a metal layer having a good step coverage and a uniform thickness using this method.

FIG. 2 is a graph of the corrosion profile of a target when using a sputtering apparatus having a magnetic field-generating member of the type disclosed in U.S. Pat. Nos. 6,228,236 and 6,183,613. Again, the target corrosion depth is in millimeters. In addition, the plot using the symbol Δ represents the corrosion profile of a target when employing a magnetic field-generating member of the type disclosed in U.S. Pat. No. 6,228,236. On the other hand, the plot using the symbol ■ represents the corrosion profile of a target when employing a magnetic field-generating member of the type disclosed in U.S. Pat. No. 6,183,614.

Referring to FIG. 2, when a titanium layer is formed under a pressure of 5 mTorr using either of the apparatuses disclosed in U.S. Pat. Nos. 6,228,236 and 6,183,613, the corrosion at the central portion of the target is more severe than at the periphery of the target. Therefore, it is difficult to obtain a metal layer having a good step coverage and a uniform thickness.

Nonetheless, various ways have been proposed to improve the step coverage or uniformity in the thickness of a metal layer formed by sputtering. For example, U.S. Pat. No. 6,274,887 (issued to Yamazaki et al.) discloses an example of a sputtering apparatus that includes a collimator. On the other hand, U.S. Pat. No. 6,121,134 (issued to Burton et al.) discloses an example of a sputtering technique employing an LTS (long throw sputter) method in which the distance between the target and the substrate is kept at least 170 mm.

Although the use of a collimator results in an improved step coverage of a titanium layer formed under a pressure of 5 mTorr, the sputtering rate of the titanium is significantly decreased. The sputtering rates according to the kind of collimator used are illustrated in Table 1 below. In Table 1, the kind of collimator is classified by the unit size of a lattice thereof.

TABLE 1

| Kind of collimator | Sputtering rate (Å/min) |
| --- | --- |
| None | 600 |
| 1 | 150 |
| 2 | 65 |
| 3 | 28 |
| 4 | 12 |

Table 1 shows that the sputtering rate is less when a collimator is employed. Also, as the lattice becomes smaller, the sputtering rate becomes lower. Thus, using a collimator lowers the productivity of the sputtering method. In addition, collimators also require maintenance and thus, their use increases the manufacturing costs.

Likewise, the LTS method can also be characterized as having a low sputtering rate. This is because the sputtered particles must traverse a relatively great distance. In fact, when the distance between the target and the substrate is increased from 50 mm to 250 mm, the sputtering rate of the metal layer is lowered by 70%. Accordingly, the LTS method is also characterized as having low productivity.

SUMMARY OF THE INVENTION

An object of the present invention is to obviate the aforementioned problems and limitations of the prior art.

Accordingly, an object of the present invention is to provide a sputtering apparatus in which a low pressure and a high density plasma can be maintained, which performs sputtering with a high degree of productivity, and which can produce a metal layer having good step coverage and a uniform thickness.

Another object of the present invention is to provide a sputtering apparatus having a magnetic field generator that can produce a corrosion profile of the target optimal for forming a metal layer having good step coverage and a uniform thickness.

The sputtering apparatus of the present invention includes a sputtering chamber, a target disposed in the sputtering chamber, and a magnetic field generator having a magnetic field-generating part forming a magnetic enclosure having an opening therethrough. The magnetic field-generating part is located at the back of the target at a position offset from a vertical axis passing through the center of the target, with the opening in the magnetic enclosure located in the direction of offset, i.e., along a line extending diametrically from said vertical axis.

Accordingly, a magnetic field having a non-uniform distribution is produced at the front surface of the target, at a location confined between the central and peripheral portions of the target, to optimize the corrosion profile of the target. Therefore, a metal layer having a good step coverage and a thickness uniformity can be formed by sputtering conducted under a low pressure using a high density plasma. Furthermore, the metal layer can be formed with a high degree of efficiency.

BRIEF DESCRIPTION OF THE DRAWINGS

The above and other objects, features and advantages of the present invention will become more apparent by referring to the following detailed description thereof made in conjunction with the accompanying drawings, of which.

DETAILED DESCRIPTION OF THE PREFERRED EMBODIMENTS

The preferred embodiments of the present invention will now be described in detail with reference to the accompanying drawings.

Figure 1:
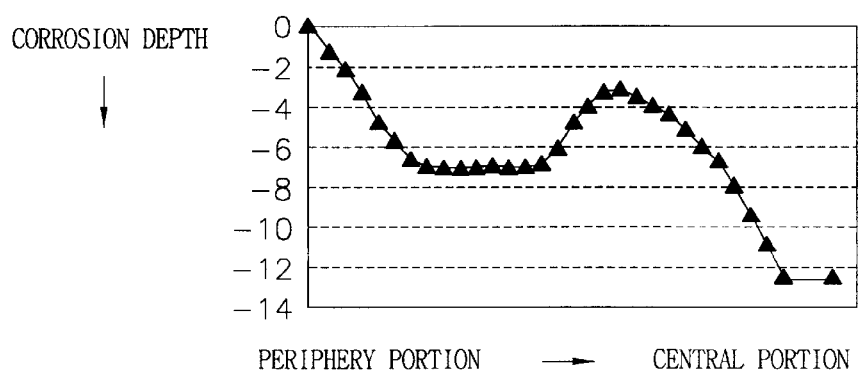
FIGS. 1 and 2 are graphs of corrosion profiles of targets upon using conventional sputtering apparatuses.
Figure 2:
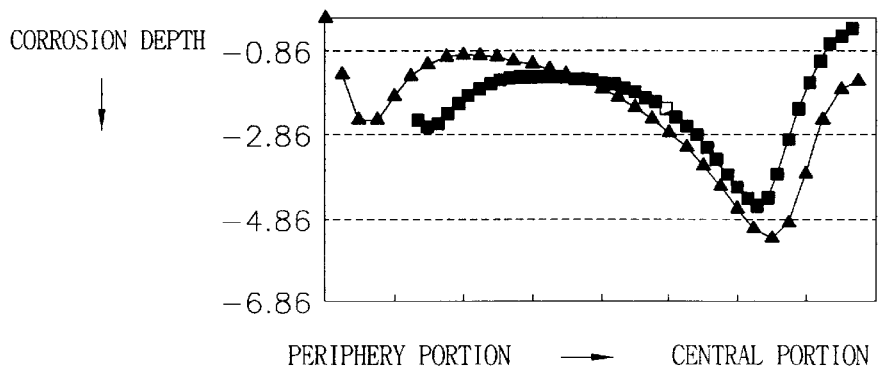
Figure 3:
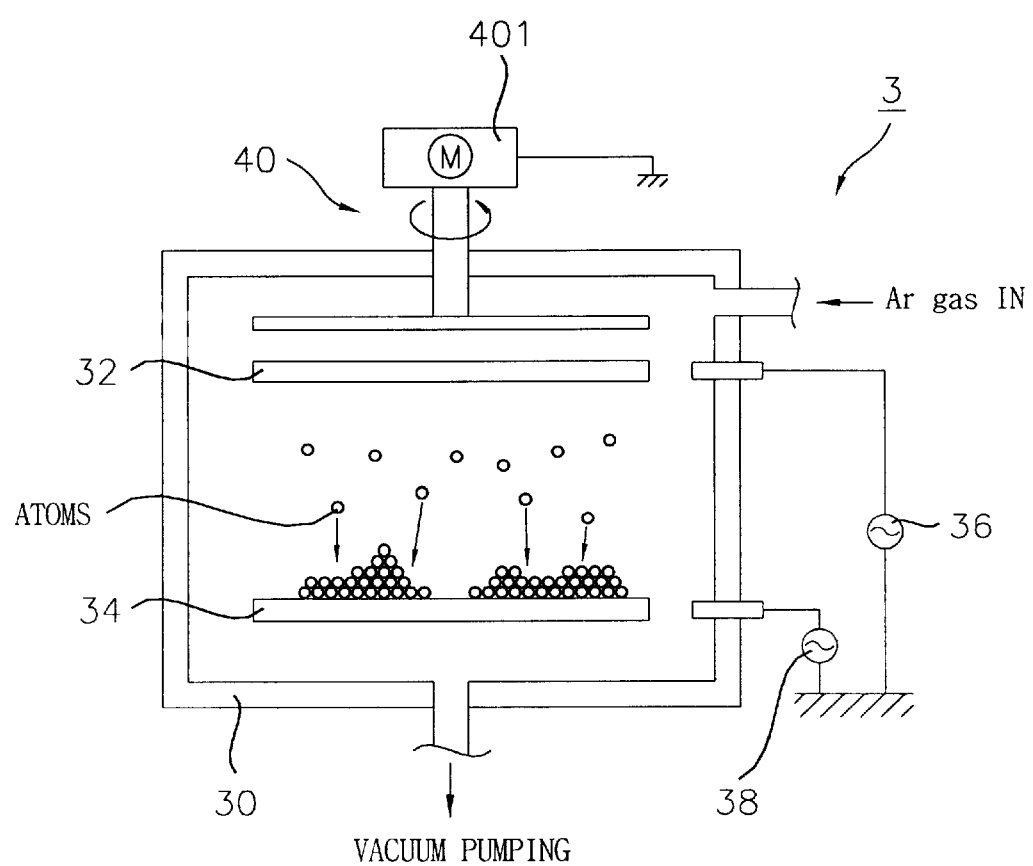
FIG. 3 is a schematic diagram of a sputtering apparatus according to the present invention.

Referring first to FIG. 3, a sputtering apparatus 3 according to the present invention includes a sputtering chamber 30. A substrate 34 is positioned within the sputtering chamber 30 at a dedicated area in front of a target 32. The sputtering apparatus 3 also includes a vacuum pump for forming a vacuum within the sputtering chamber 30 by pumping gas from the chamber. The sputtering chamber 30 is also connected to a plasma power source 36 for providing power that generates plasma. In particular, the plasma power source 36 is connected to the target 32. The substrate 34 is connected to a bias power source 38 for applying a bias thereto. Gas, such as argon, introduced into the sputtering chamber 30 is changed into plasma. The thus generated plasma impacts the target 32 to sputter atoms from the target 32. The atoms sputtered from the front of the target 32 are deposited on the substrate 34 to form a metal layer.

Figure 4:
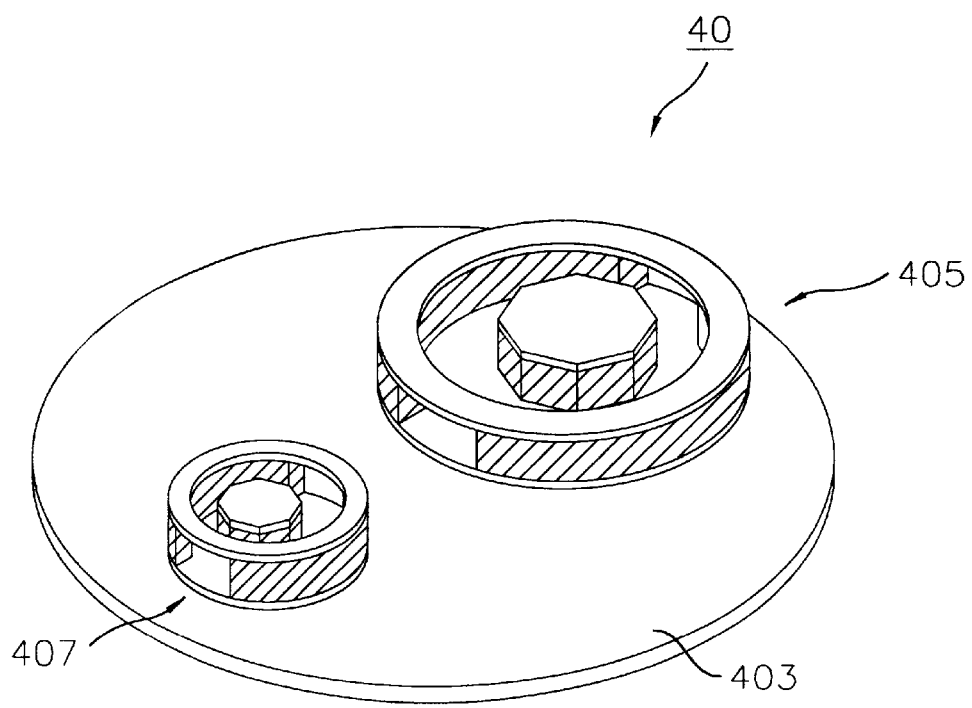
FIG. 4 is a perspective view of an essential portion of a magnetic field generator of the sputtering apparatus shown in FIG. 3.

The sputtering apparatus 3 also includes a magnetic field generator 40 for producing a magnetic field at the front of the target 32. The magnetic field generator 40 comprises a magnetic enclosure that can effectively control the behavior of the atoms sputtered from the target 32. FIG. 4 is a perspective view of the portion of the magnetic field generator 40 that comprises such an enclosure.

Referring now to FIG. 4, the magnetic field generator 40 includes a support 403 in the form of a plate. The magnetic field generator 40 is oriented such that a vertical line passing through the geometric center of the support plate 403 coincides with a vertical axis passing through the center of the target 32. That is, the support plate 403 and the target 32 are centered relative to each other. The magnetic field generator 40 also includes a main magnetic field-generating part 405 disposed on the surface of the support plate 403 offset from the vertical axis passing through the center of the target 32. Thus, the main magnetic field-generating part 405 produces a magnetic field that is offset laterally from the center of the target.

Still further, the magnetic field generator 40 includes a rotary drive unit, such as a motor, 401 for rotating the support plate 403. The drive unit 401 is connected to the surface of the support plate 403 opposite that on which the main magnetic field-generating part 405 is disposed. When the support plate 403 is rotated by the drive unit 401, a magnetic field is generated by the main magnetic field-generating part 405 from the back of the target to the front thereof. The behavior of the atoms sputtered from the target can be effectively controlled by the magnetic field at the front of the target.

The structure of the main magnetic field-generating part 405 will now be described in detail with reference to FIG. 5. The main magnetic field-generating part 405 includes a magnetic annulus that forms a magnetic field-forming enclosure having an opening extending diametrically therethrough. The magnetic annulus is constituted by a generally annular first magnet 405c having a predetermined curvature, and a first opening 405a and a second opening 405b. More specifically, the first magnet 405c comprises two arcuate magnet segments whose ends are spaced from one another to form the first and second openings 405a and 405b. The area of the first opening 405a is larger than that of the second opening 405b. In particular, the area of the first opening 405a is about 1.1–2 times that of the second opening 405b. In addition, the first opening 405a is located closer to the center of the support plate 403 than the second opening 405b. Further, the first magnet 405c is positioned so that the first and the second openings 405a and 405b are located along the same horizontal diametric line of the support plate 403. The main magnetic field-generating part 405 also includes a second magnet 405d disposed radially inwardly of the first magnet 405c. The second magnet 405d is positioned nearer to the second opening 405b than the first opening 405a.

The first and second magnets 405c and 405d are oriented so that the magnet field lines thereof are in the vertical direction. That is, the magnets 405c and 405d have an N-pole that faces the back of the target and an S-pole in contact with the support plate 403. As a result, the magnetic force acts in the vertical direction at the back of the target. The intensity of the magnetic field can be adjusted, i.e., increased, through proper arrangement of first and the second magnets 405c and 405d in the vertical direction.

Accordingly, a magnetic field having a predetermined non-uniform distribution (having the profile of an asymmetrical crater) is created at the backside of the target 32 by the main magnetic field-generating part 405, and mainly at a location between the central and peripheral portions of the target. The behavior of the atoms sputtered from the target can be effectively controlled and the corrosion profile of the target is thus optimized as will be described in more detail later on.

The main magnetic field-generating part 405 also includes a first frame 405e, a second frame 405f and a third frame 405g. The first frame 405e has the form of a plate and a size corresponding to the annular enclosure formed by the first magnet 405c. The second frame 405f is annular and has a diameter corresponding to that of the first magnet 405c. The first frame 405e is attached to the support 403, and the first magnet 405c is interposed between the first and the second frames 405e and 405f. The third frame 405g has the form of a plate and is sized to cover the second magnet 405d. The second magnet 405d, therefore, is positioned between the first and the third frames 405e and 405g. The first, second and third frames 405e, 405f and 405g fix the first and the second magnets 405c and 405d firmly in place. In addition, the first, second and third frames 405e, 405f and 405g comprise a magnetic substance. Thus, the intensity of the magnetic field generated by the magnets 405c and 405d is enhanced by the first, second and third frames 405e, 405f and 405g.

Referring back to FIG. 4, the magnetic field-generator 40 also includes a supplementary magnetic field-generating part 407. The supplementary magnetic field-generating part 407 is disposed on the support plate 403 to one side of the center of the support plate 403 opposite the side on which the main magnetic field-generating part 405 is disposed. Accordingly, the main and supplementary magnetic field-generating parts 405 and 407 independently generate magnetic fields that envelop the target. The magnetic fields thus generated act as one magnetic field especially because the magnetic field generator 40 is rotated.

The structure of the supplementary magnetic field-generating part 407 will be described in more detail with reference to FIG. 6. The supplementary magnetic field-generating part 407 includes a magnetic annulus comprising a third annular magnet 407c having a predetermined curvature. The third magnet 407c forms a (second) magnetic field-forming enclosure having a third opening 407a and a fourth opening 407b extending radially therethrough. More specifically, the third magnet 407 comprises two arcuate magnet segments whose ends are spaced across from one another to form the third and the fourth openings 407a and 407b. The third opening 407a is larger than the fourth opening 407b. In particular, the area of the third opening 407a is about 1.1–2 times that of the fourth opening 407b. In addition, the third opening 407a is located closer to the center of the support plate 403 than the fourth opening 407b. Furthermore, the third magnet 407c is oriented so that the third and the fourth openings 407a and 407b are located along the same horizontal line extending from the geometric center of the support plate 403 (i.e., along a diametric line of the support plate 403). In fact, the first and the second openings 405a and 405b of the main magnetic field-generating part 405 and the third and the fourth openings 407a and 407b of the supplementary magnetic field-generating part 407 all lie along the same horizontal line passing through the geometric center of the support plate 403 (in this case, the same diametric line of the support plate 403).

The supplementary magnetic field-generating part 407 includes a fourth magnet 407d disposed radially inwardly of the annular third magnet 407c. The fourth magnet 407d is disposed closer to the fourth opening 407b than the third opening 407a. The supplementary magnetic field-generating part 407 thus also generates a magnetic field having a non-uniform distribution at the backside of the target.

Moreover, the third and fourth magnets 407c and 407d are oriented so that the magnetic field lines thereof extend vertically (perpendicular to the support plate 403). That is, the third and fourth magnets 407c and 407d have an N-pole that faces the back of the target and an S-pole in contact with the support plate 403. As a result, the magnetic force is generated along a vertical direction at the back of the target. The intensity of the magnetic field, though, can be adjusted, i.e., increased, by proper arrangement of third and fourth magnets 407c and 407d vertically at the back of the target. Accordingly, the behavior of the atoms (or particles) sputtered from the target can be effectively controlled, and the corrosion profile of the target can be optimized to produce a metal layer having a good step coverage and a uniform thickness.

The supplementary magnetic field-generating part 407 also includes a fourth frame 407e, a fifth frame 407f and a sixth frame 407g. The fourth, fifth and sixth frames 407e, 407f and 407g, fix the third and the fourth magnets 407c and 407d in place. The fourth frame 407e is in the form of a plate shape and has a size corresponding to that of the enclosure formed by the third magnet 407c. The fifth frame 407f is annular and has a diameter corresponding to that off the third magnet 407c. The fourth frame 407e is attached to the support plate 403 and the fifth magnet 407c is interposed between the fourth and the fifth frames 407e and 407f. The sixth frame 407g is in the form of a plate shape and is sized to cover the fourth magnet 407d. The fourth magnet 407d is positioned between the fourth and the sixth frames 407e and 407g. Also, the fourth, fifth and sixth frames 407e, 407f and 407g comprise a magnetic substance. Thus, the fourth, fifth and sixth frames 407e, 407f and 407g enhance the intensity of the magnetic field generated by the magnets 407c and 407d of the supplementary magnetic field-generating part 407.

Although the structure of the supplementary magnetic field-generating part 407 is similar to that of the main magnetic field-generating part 405, the main magnetic field-generating part 405 is larger than the supplementary magnetic field-generating part 407. In particular, the main magnetic field-generating part 405 is about 1.5–2 times larger than the supplementary magnetic field-generating part 407.

Figure 7:
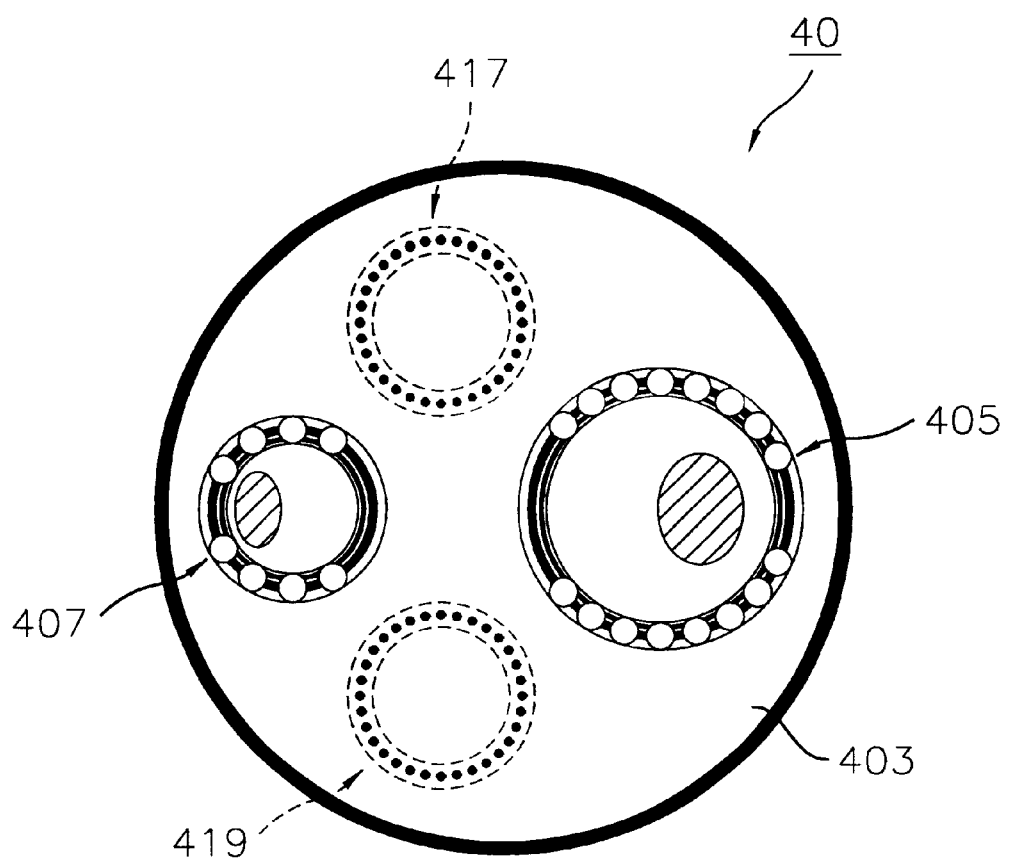
FIG. 7 is a plan view of an essential portion of another embodiment of a magnetic field generator according to the present invention.

In addition, the magnetic field generator 40 may comprise a plurality of supplemental magnetic field-generating parts, as shown in the embodiment of FIG. 7. Referring to FIG. 7, three supplementary magnetic field-generating parts 407, 417 and 419 are shown. The supplementary magnetic field-generating parts 407, 417 and 419 are disposed on the support plate 403 as offset from the center of the support plate 403 and spaced from the main magnetic field-generating part 405. The number of supplementary magnetic field-generating parts is only limited by the size of the supporting plate 403 and the magnetic field-generating parts themselves.

The height of the main magnetic field-generating part 405 differs from that of the supplementary magnetic field-generating part(s) 407. More specifically, the height (thicknesses) of the first and the second magnets 405c and 405c are the same, and the height (thicknesses) of the third and the fourth magnets 407c and 407d are the same. However, the third and the fourth magnets 407c and 407d are taller (thicker) than the first and third magnets 405c and 405d, as best shown in FIG. 8.

Figure 8:
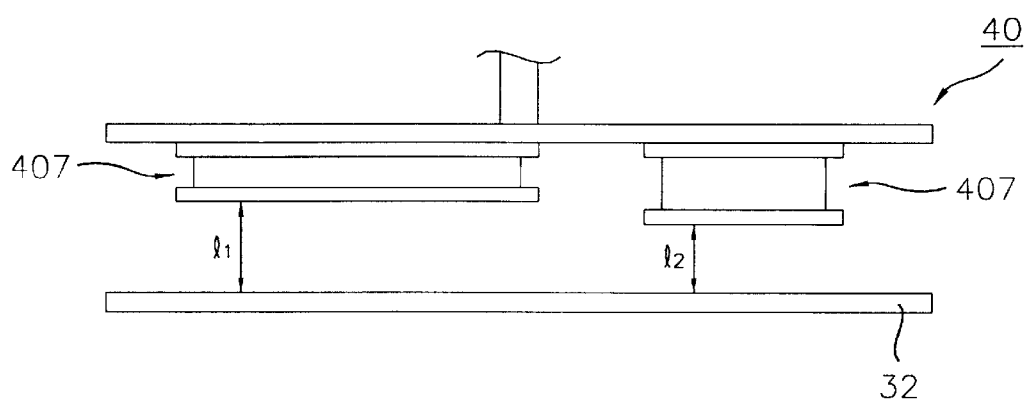
FIG. 8 is a side view of part of the sputtering apparatus of FIG. 3, showing relative distances from the back of a target to the main and supplementary magnetic field-generating parts.

Referring now to FIG. 8, the magnetic annuli of the main and supplementary magnetic field-generating parts 405 and 407 lie in planes parallel to the plane of the target 32. The distance ($l_1$) between the main magnetic field-generating part 405 and the back of the target is less than the distance ($l_2$) between the supplementary magnetic field-generating part 407 and the back of the target. In particular, the ratio of the distances ($l_2$) to ($l_1$) is within the range of about 0.80–0.95. Accordingly, a stabilized plasma can be obtained for the sputtering process.

In addition, the magnetic field generator 40 preferably generates a magnetic field of about 1,400–1,800 Gauss as measured at the front of the target 32. When the magnetic field is weaker than 1,400 Gauss, the sputtered atoms cannot be controlled efficiently, and when the magnetic field exceeds 1,800 Gauss, the behavior of the atoms is restrained.

Next, experiments used to optimize the design of the magnetic field generator of the present invention designed will be described below.

Figure 9A:
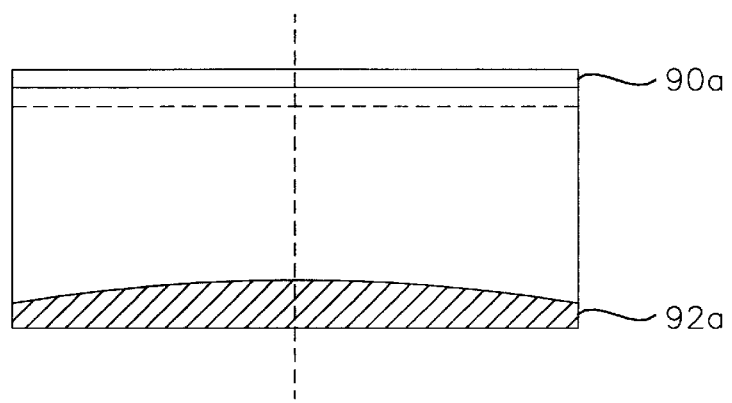
FIGS. 9A to 9C are each a diagram of a deposition profile of a metal layer with respect to a respective corrosion profiles of a target.

Relationship Between the Corrosion Profile of a Target and the Deposition Profile of a Metal Layer Referring to FIG. 9A, when the entire surface 90a of the target is corroded uniformly, a metal layer having a deposition profile 92a in which the central portion is thicker than the peripheral portion is formed.

Figure 9B:
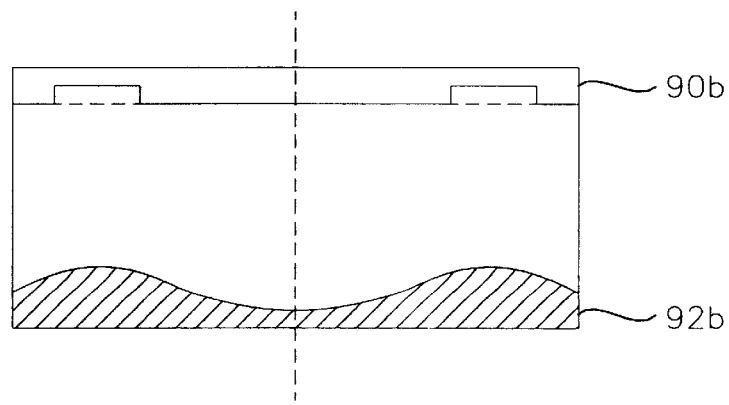

Referring to FIG. 9B, when peripheral portions of the surface 90b of the target are corroded more than the other portions thereof, a metal layer having a deposition profile 92b in which the periphery is thicker than the central portion is formed.

Figure 9C:
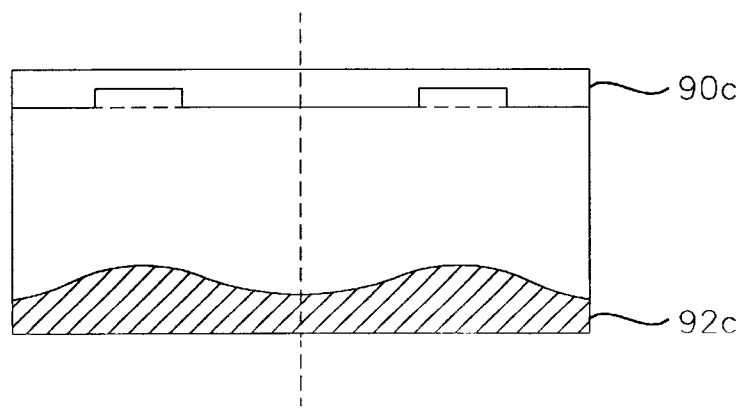

Referring to FIG. 9C, when portions of the surface 90c of the target between the periphery and the central portion of the target are corroded more than the other portions thereof, a metal layer having a deposition profile 92c of a relatively uniform thickness is formed.

Through these experimental observations it was noted that a metal layer having a good deposition profile is obtained when intermediate portions of the target, between the periphery and the central portion of the target, are corroded.

Figure 5:
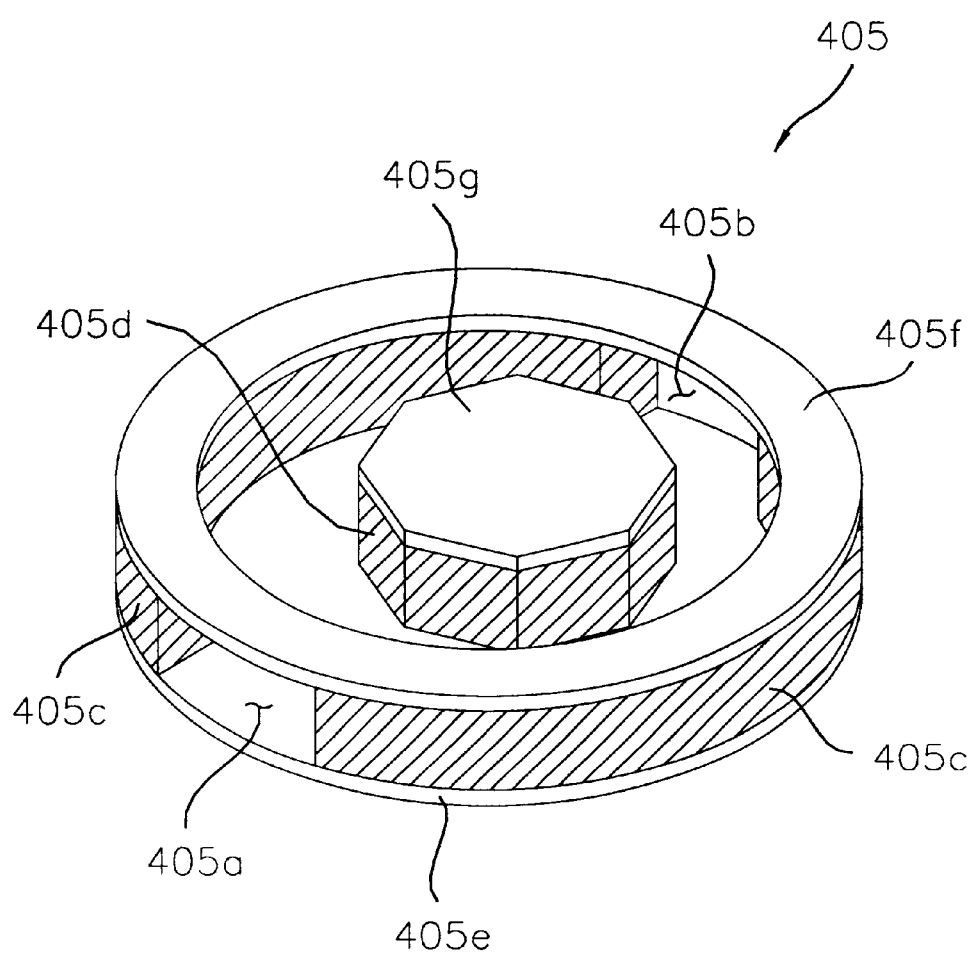
FIG. 5 is a perspective view of a main magnetic field-generating part of the magnetic field generator.
Figure 6:
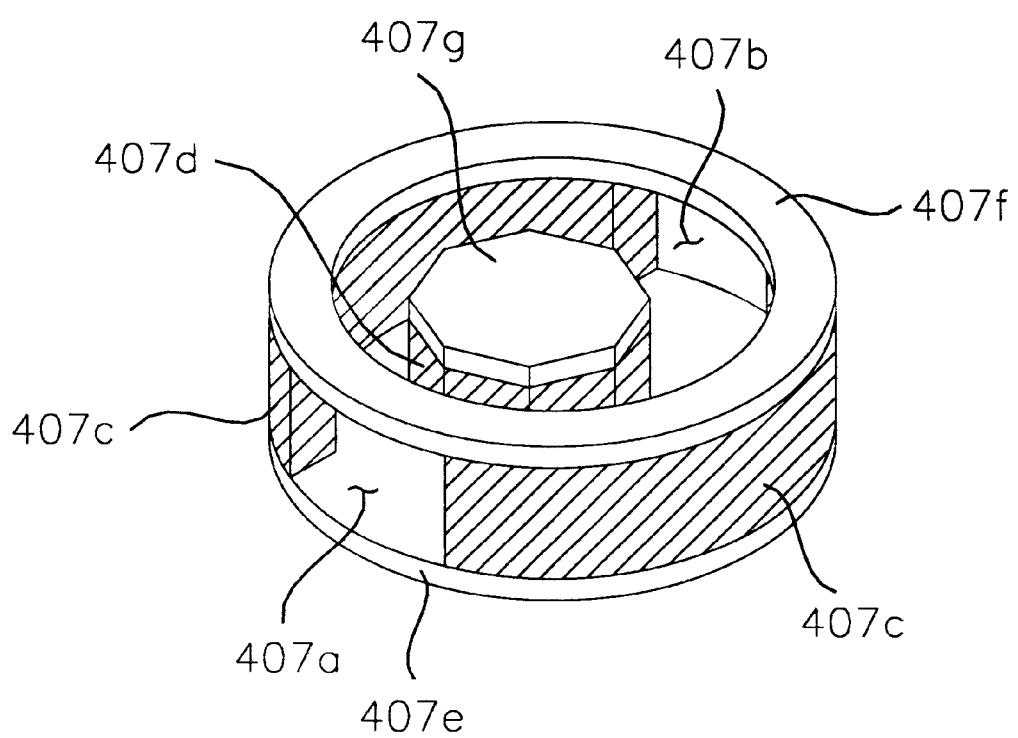
FIG. 6 is a perspective view of a supplementary magnetic field-generating part of the magnetic field generator.
Figure 10:
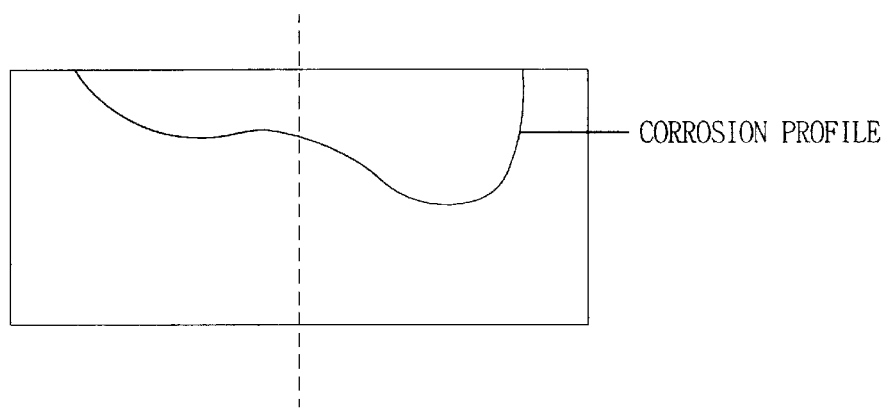
FIG. 10 is a diagram of a corrosion profile of a target obtained using the main magnetic field-generating part shown in FIG. 5.
Figure 11:
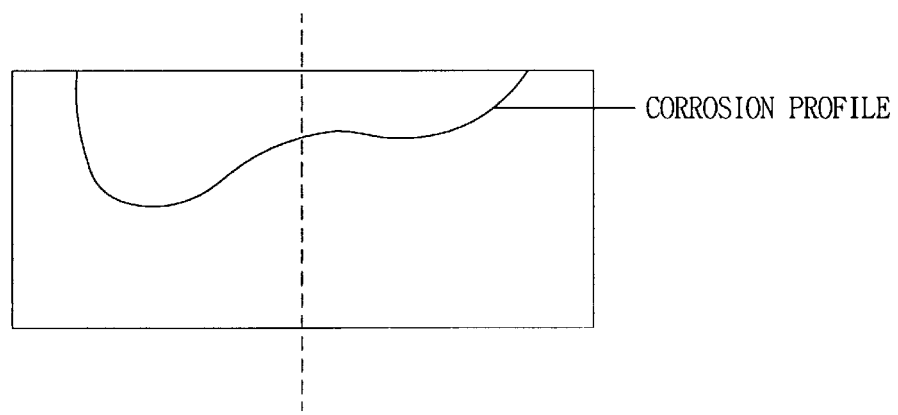
FIG. 11 is a diagram of a corrosion profile of a target obtained using the supplementary magnetic field-generating part shown in FIG. 6.
Figure 12:
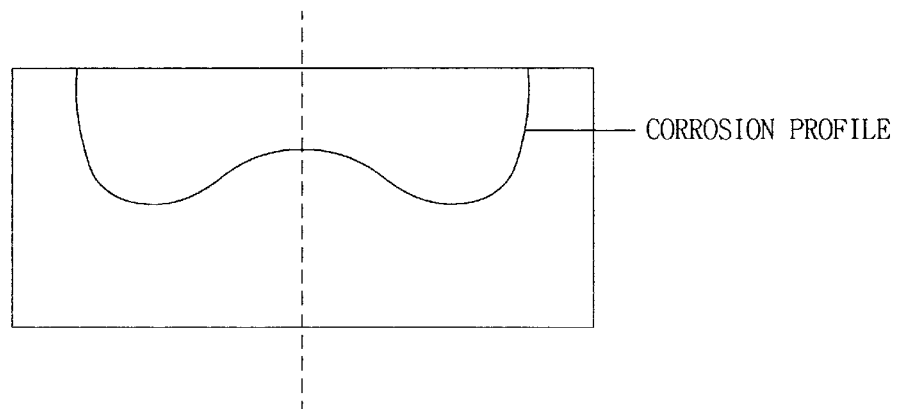
FIG. 12 is a diagram of a corrosion profile of a target obtained using the magnetic field generator according to the present invention.

Optimization of the Design of a Magnetic Field Generator Based on the Corrosion Profile of the Target FIG. 10 shows the corrosion profile of a target when the main magnetic field-generating part 405 shown in FIG. 5 is used in the apparatus of FIG. 3, and FIG. 11 shows the corrosion profile of a target when the supplementary magnetic field-generating part 407 shown in FIG. 6 is used in the apparatus of FIG. 3. On the other hand, FIG. 12 shows the corrosion profile of a target when both the main magnetic field-generating part 405 and the supplementary magnetic field generating part 407 are used. As is clear from FIG. 12, the corrosion profile of the target is similar to the profile illustrated in FIG. 9C.

As is self-evident from FIGS. 10–12, the main and supplementary magnetic field-generating parts 405 and 407 coact to produce a magnetic field that is optimal in helping produce a metal layer having a good step coverage and a uniform thickness.

Figure 13:
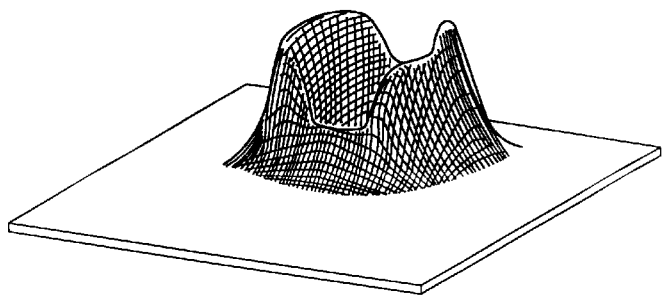
FIG. 13 is a perspective view of the distribution of a magnetic field provided by the magnetic field generator according to the present invention.

Optimization of the Design of the Openings and Curvature of the Outer Magnets of the Magnetic Field-Generating Parts FIG. 13 shows the distribution of the magnetic field generated by the main magnetic field-generating part 405. Referring to FIG. 13, the distribution of the magnetic field generated by the main magnetic field-generating part 405 is non-uniform because of the first and the second openings 405a and 405b in the curved first magnet 405c. Note, the supplementary magnetic field-generating part 407 generates a magnetic field having a non-uniform distribution thus similar to that of the magnetic field generated by the main magnetic field-generating part 405.

In addition, a high intensity magnetic field facilitates the establishing of the desirable conditions of low pressure and high density for the plasma process. To this end, the magnets preferably comprise an Nd—Fe—B-based substance whereas the frames preferably comprise a steel-based substance.

As described above, process conditions of low pressure and high density can be established using a magnetic field generating part according to the present invention. In addition, a metal layer having a good step coverage and a uniform thickness can be formed while maintaining high productivity.

Comparison of Corrosion Profiles of Targets

Figure 14:
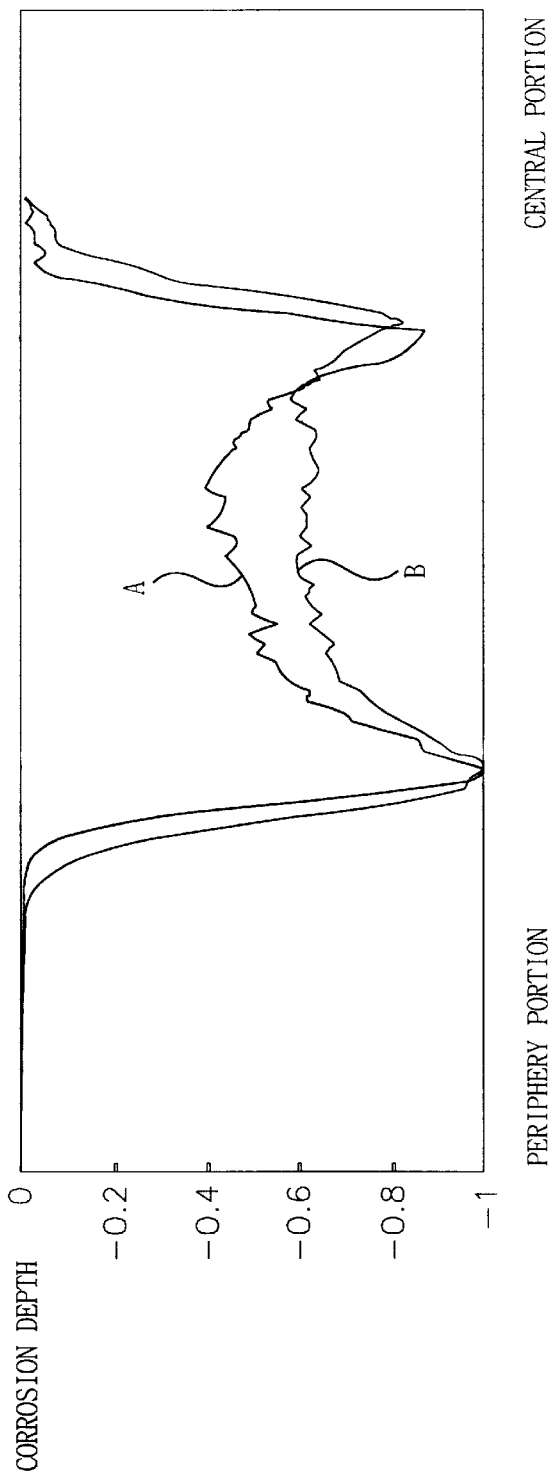
FIG. 14 is graph showing the corrosion profiles of targets obtained using the present invention and a conventional sputtering apparatus under the same sputtering conditions, respectively.

FIG. 14 illustrates the corrosion profiles of targets using the sputtering apparatus of the present invention and a conventional sputtering apparatus respectively. In particular, plot A represents the corrosion profile of a target when employing a magnetic field generator of the type disclosed in U.S. Pat. No. 6,183,614, and plot B represents the corrosion profile of a target when employing a magnetic field generator according to the present invention. The sputtering processes were implemented under the same conditions for both cases. As is clear from the figure, the corrosion profile of the target obtained when employing the magnetic field generator according to the present invention was better.

In summary, the present invention can be used to advantageously control the corrosion profile of the target during sputtering of a metal layer, in such a way that defects in the metal layer can be minimized. Also, because the corrosion profile of the target is controlled by a magnetic field having a non-uniform distribution according to the present invention, the metal layer will have a good step coverage and a uniform thickness. Still further, the present invention facilitates the establishing of desirable low pressure and high density conditions during the sputtering process without adversely affecting the productivity of the sputtering process, unlike the prior art technique of using a collimator and the prior art LTS method.

Finally, although the present invention has been described above in connection with the preferred embodiments thereof, various changes thereto and modifications thereof will become apparent to those skilled in the art. All such changes and modifications are seen to be within the true spirit and scope of the present invention as defined by the appended claims.

What is claimed is:

1. A sputtering apparatus comprising:
   a sputtering chamber having an area therein dedicated to receive a substrate while a layer is being formed on the substrate by sputtering;
   a target disposed within said sputtering chamber, the front of said target facing the area that the substrate occupies during sputtering; and
   a magnetic field generator including a main magnetic field-generating part facing the back of said target, the main magnetic field-generating part comprising a magnetic annulus offset horizontally from a vertical axis passing through the center of said target, said magnetic annulus having an opening extending diametrically therethrough, and said opening being located along a diametric line extending in the direction in which the magnetic annulus is offset from said vertical axis.

2. A sputtering apparatus as claimed in claim 1, wherein said magnetic field generator further comprises: a support plate having a geometric center through which said vertical axis passes, said main magnetic field-generating part being disposed on and fixed to said support plate; and a rotary drive unit connected to said support plate so as to rotate said support plate about said vertical axis.

3. A sputtering apparatus as claimed in claim 2, wherein said main magnetic field-generating part comprises: a first magnet constituting said magnetic annulus, said first magnet having positive and negative poles disposed vertically one above the other, and said first magnet having an overall annular shape and a first opening and a second opening extending radially therethrough, said first opening being located closer to said vertical axis than said second opening; and a second magnet having positive and negative poles disposed vertically one above the other, said second magnet being disposed radially inwardly of said first magnet and being located closer to said second opening than said first opening.

4. A sputtering apparatus as claimed in claim 3, wherein said main magnetic field-generating part comprises: a first frame in the form of a plate having an outer shape corresponding to that of said first magnet, said first frame being attached to said support plate, and said first frame comprising a magnetic substance; a second frame comprising the same magnetic substance as said first frame, said second frame being annular and having a diameter corresponding to that of said first magnet; and a third frame comprising the same magnetic substance as said first frame, said third frame being in the form of a plate and covering said second magnet, and wherein said first magnet is interposed between said first frame and said second frame, and said second magnet is interposed between said first frame and said third frame.

5. A sputtering apparatus as claimed in claim 3, wherein said magnetic field generator comprises at least one supplementary magnetic field-generating part that generates a magnetic field, each said supplementary magnetic field-generating part comprising a second magnetic annulus offset horizontally from said vertical axis of rotation, and said second magnetic annulus having an opening extending diametrically therethrough, the opening through said second magnetic annulus being located along the direction in which the second magnetic annulus is offset from said vertical axis.

6. A sputtering apparatus as claimed in claim 5, wherein said at least one supplementary magnetic field-generating part comprises a plurality of supplementary magnetic field-generating parts spaced from one another on said support plate.

7. A sputtering apparatus as claimed in claim 5, wherein each said at least one supplementary magnetic field-generating part comprises: a third magnet constituting said second annulus and having positive and negative poles disposed vertically one above the other on said support plate, the third magnet having an overall annular shape and a third opening and a fourth opening extending radially therethrough, the third opening being located closer to said vertical axis than said fourth opening, and said third magnet being smaller in diameter than said first magnet of said main magnetic field-generating part and having a height greater than that of said first magnet; and a fourth magnet having positive and negative poles disposed vertically one above the other on said support plate, said second magnet being disposed radially inwardly of said third magnet and closer to said fourth opening than said third opening.

8. A sputtering apparatus as claimed in claim 7, wherein each said supplementary magnetic field-generating part comprises: a fourth frame in the form of a plate having an outer shape corresponding to that of said third magnet, said fourth frame being attached to said support plate, and said fourth frame comprising a magnetic substance; a fifth frame comprising the same magnetic substance as said fourth frame, said fifth frame being annular and having a diameter corresponding to that of said third magnet; and a sixth frame comprising the same magnetic substance as said fourth frame, said sixth frame being in the form of a plate and covering said fourth magnet, and wherein said third magnet is interposed between said fourth frame and said fifth frame, and said fourth magnet is interposed between said fourth frame and said sixth frame.

9. A sputtering apparatus as claimed in claim 5, wherein the magnetic annulus of said main magnetic field-generating part and a said supplementary magnetic field-generating part have respective central longitudinal axes located along a diametric line of said support plate.

10. A sputtering apparatus as claimed in claim 5, wherein said main magnetic field-generating part is about 1.1–2 times the size of said supplementary magnetic field-generating part.

11. A sputtering apparatus as claimed in claim 5, wherein a ratio of the distance from said main magnetic field-generating part to the back of said target and the distance from said supplementary magnetic field generating-part to the back of said target is about 1:0.80–0.95.

12. A sputtering apparatus as claimed in claim 7, wherein said first opening, said second opening, said third opening and said fourth opening are all located along the same diametric line of said support plate.

13. A sputtering apparatus as claimed in claim 7, wherein the area of said first opening is about 1.1–2 times that of said second opening area, and the area of said third opening is about 1.1–2 times that of said fourth opening.

14. A sputtering apparatus as claimed in claim 7, wherein an S pole of said first magnet, said second magnet, said third magnet and said fourth magnet faces said support plate, and an N pole of said first magnet, said second magnet, said third magnet and said fourth magnet faces the back of said target.

15. A sputtering apparatus as claimed in claim 1, wherein the magnetic annulus of said magnetic field generator and said target lie in respective planes extending parallel to one another.

16. A sputtering apparatus as claimed in claim 1, wherein said magnetic annulus has a curved shape.

17. A sputtering apparatus as claimed in claim 1, wherein the main magnetic field-generating part is oriented such that a magnetic force produced thereby acts in a vertical direction.

18. A sputtering apparatus as claimed in claim 1, wherein said magnetic field generator produces a magnetic field of about 1,400–1,800 Gauss at the front surface of said target.

* * * * *